United States Patent
Mohan et al.

(10) Patent No.: US 10,644,714 B2
(45) Date of Patent: May 5, 2020

(54) PIPELINED ANALOG-TO-DIGITAL CONVERTER

(71) Applicant: TEXAS INSTRUMENTS INCORPORATED, Dallas, TX (US)

(72) Inventors: Arun Mohan, Bengaluru (IN); Neeraj Shrivastava, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/358,456

(22) Filed: Mar. 19, 2019

(65) Prior Publication Data

US 2019/0296758 A1   Sep. 26, 2019

(30) Foreign Application Priority Data

Mar. 22, 2018  (IN) .............................. 201841010558

(51) Int. Cl.
| | |
|---|---|
| *H03M 1/00* | (2006.01) |
| *H03M 1/12* | (2006.01) |
| *H03F 3/04* | (2006.01) |
| *H03M 1/06* | (2006.01) |
| *H03M 1/38* | (2006.01) |

(52) U.S. Cl.
CPC ............ *H03M 1/1215* (2013.01); *H03F 3/04* (2013.01); *H03M 1/0695* (2013.01); *H03M 1/38* (2013.01)

(58) Field of Classification Search
CPC .... H03M 1/1215; H03M 1/0695; H03M 1/38; H03M 1/403; H03M 1/40
USPC .......................... 341/144, 155, 161, 163, 122
See application file for complete search history.

(56) References Cited

U.S. PATENT DOCUMENTS

| | | | | |
|---|---|---|---|---|
| 4,763,107 | A * | 8/1988 | Koen ................... | G11C 27/026 341/156 |
| 2006/0077086 | A1* | 4/2006 | Cringean ............ | H03M 1/1215 341/155 |
| 2012/0319879 | A1* | 12/2012 | Ali ...................... | H03M 1/1014 341/118 |
| 2013/0106630 | A1* | 5/2013 | Wong ..................... | H03M 1/46 341/110 |

* cited by examiner

*Primary Examiner* — Peguy Jean Pierre
(74) *Attorney, Agent, or Firm* — John R. Pessetto; Charles A. Brill; Frank D. Cimino

(57) ABSTRACT

An analog-to-digital converter including a first stage and a second stage. The first stage includes a first sample-and-hold (SH) having an input coupled to a voltage input node of the ADC, and having a first SH output. The first stage also includes a buffer, a first flash converter and a first digital-to-analog converter (DAC). The buffer has an input coupled to the first SH output and has a buffer output. The first flash converter has an input coupled to the first SH output, and has a first flash converter output. The first DAC has an input coupled to the first flash converter output. The second stage includes a second flash converter having an input coupled to the buffer output.

18 Claims, 7 Drawing Sheets

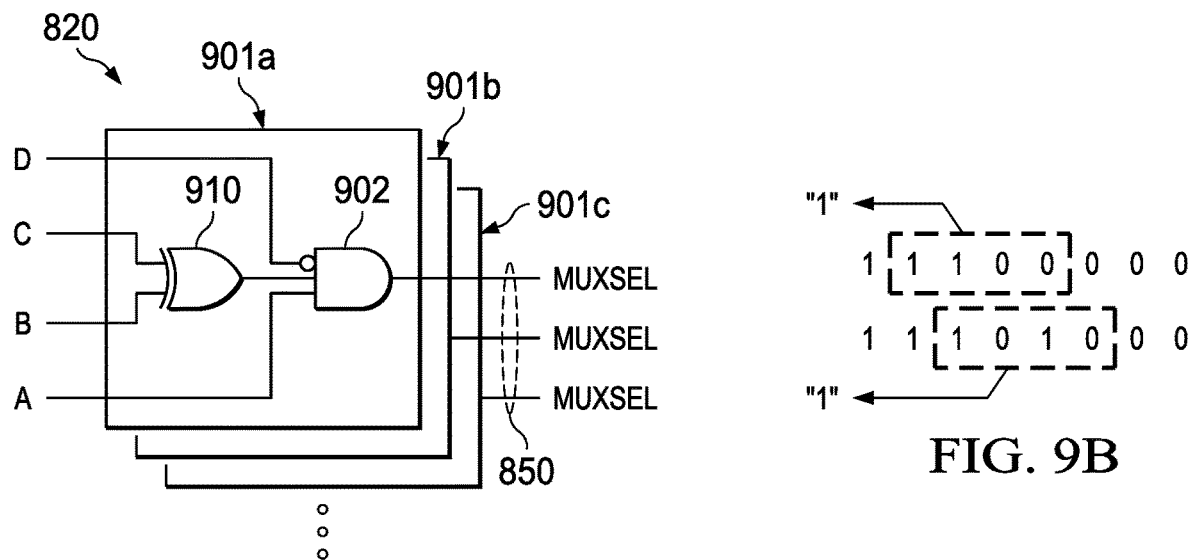
FIG. 9A
FIG. 9B
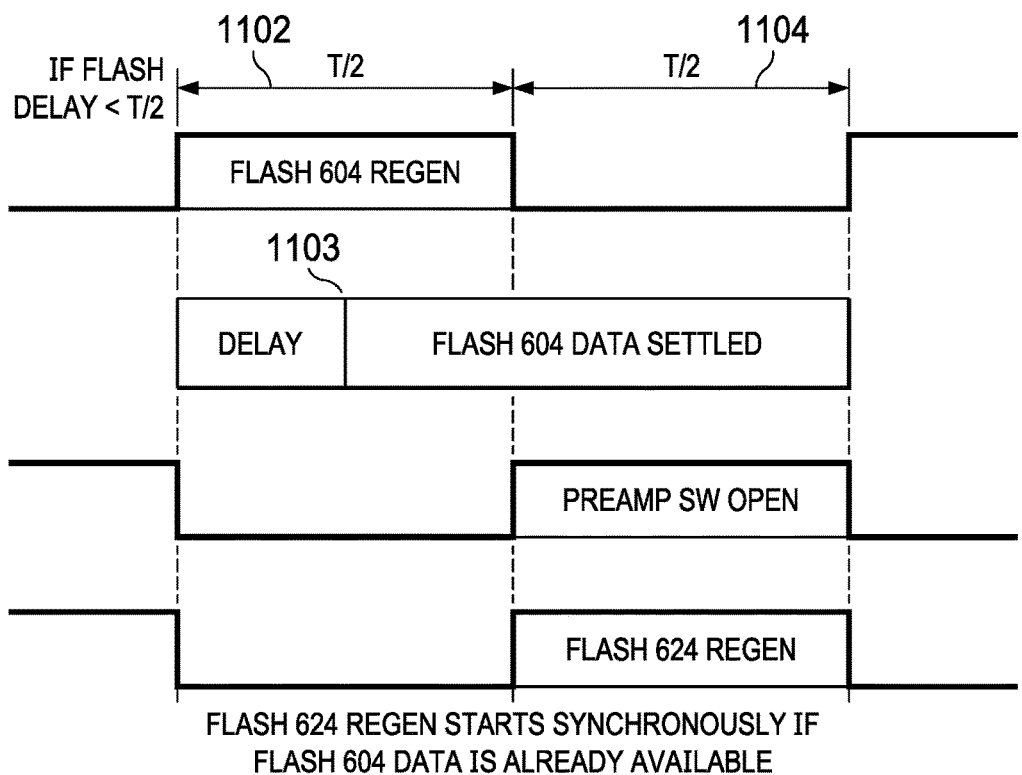
FIG. 11

PIPELINED ANALOG-TO-DIGITAL CONVERTER

CROSS-REFERENCE TO RELATED APPLICATIONS

This application claims priority to India Provisional Application No. 201841010558, filed Mar. 22, 2018, which is hereby incorporated by reference.

BACKGROUND

An analog-to-digital converter (ADC) converts an input analog signal to a digital output signal. The digital output signal is representative of the analog input signal. One type of ADC is a pipelined ADC that includes one or more flash converters.

SUMMARY

In one example, an analog-to-digital converter including a first stage and a second stage. The first stage includes a first sample-and-hold (SH) having an input coupled to a voltage input node of the ADC, and having a first SH output. The first stage also includes a buffer, a first flash converter and a first digital-to-analog converter (DAC). The buffer has an input coupled to the first SH output and has a buffer output. The first flash converter has an input coupled to the first SH output, and has a first flash converter output. The first DAC has an input coupled to the first flash converter output. The second stage includes a second flash converter having an input coupled to the buffer output.

BRIEF DESCRIPTION OF THE DRAWINGS

For a detailed description of various examples, reference will now be made to the accompanying drawings in which:

FIG. 9A shows an example of a logic circuit usable in the implementation of FIG. 8.

FIG. 9B illustrates the function performed by the logic circuit of FIG. 9A.

FIG. 11 shows an example timing diagram pertaining to the comparator of FIG. 10.

DETAILED DESCRIPTION

Figure 1:
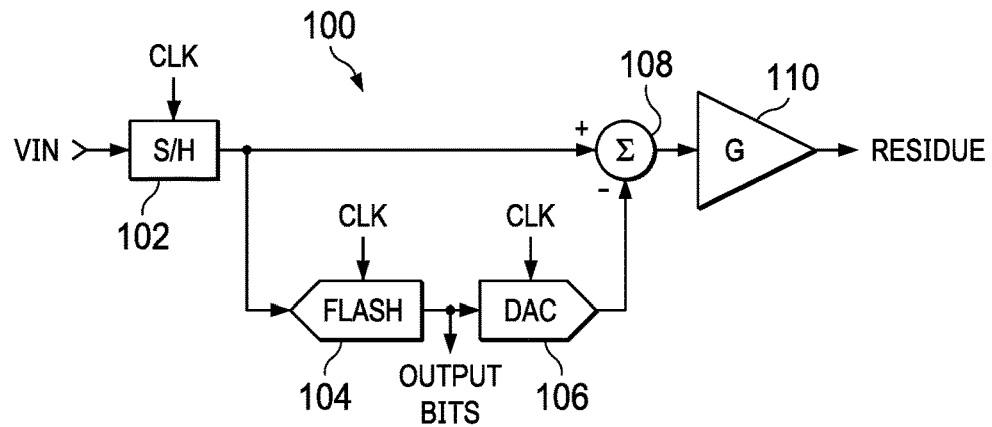
FIG. 1 illustrates an example stage of a pipelined analog-to-digital converter (ADC).

FIG. 1 shows an example of a single stage 100 of a pipelined ADC architecture. The single stage 100 includes a sample-and-hold (SH) 102, a flash converter 104, a digital-to-analog converter (DAC) 106, a voltage subtractor 108, and an amplifier 110 (with gain G). The analog input voltage is shown as VIN and is sampled and held by SH 102. The sampled input voltage from SH 102 is provided to flash converter 104, which converts the sampled input voltage to a digital representation. The flash converter 104 includes multiple comparators, and each comparator compares the sampled input voltage to a separate reference voltage. The output from flash converter 104 represents the n most significant bits of the digital representation of VIN. The flash converter 104 of this signal stage 100 has a resolution that is lower than the resolution of the overall pipelined ADC of which the stage 100 is a part. For example, the overall resolution of the ADC may be, for example, 12 bits, while the resolution of stage 100 is 3 bits. Each stage of the ADC provides some of the digital bits of the final digital representation of VIN. As stage 100 is the first stage in the pipelined architecture, stage 100 generates the most significant n bits of the final digital representation of VIN. If the resolution of stage 100 is 3 bits, then stage 100 generates the 3 most significant bits.

The flash converter 104, having a lower resolution than the overall ADC, produces a digital representation that is not necessarily the same as what the final digital representation of VIN would be from the combined efforts of all of the stages. The flash converter's output is converted back to an analog signal by DAC 106. The DAC 106 in this example may be implemented as a capacitive DAC. The analog output from DAC 106 is then subtracted from the sampled VIN by voltage subtractor 108. The difference signal from voltage subtractor 108 is then amplified by amplifier 110 to produce a residue, which is then provided to the next stage of the pipelined architecture. The next stage may be the same or similar to that shown in FIG. 1 and operates to generate the next set of bits of the digital representation of VIN. The pipelined architecture includes one or more stages such as that shown in FIG. 1. The last stage of the ADC may only include a flash converter 104 to produce the one or more least significant bits of the digital representation of VIN.

Figure 2:
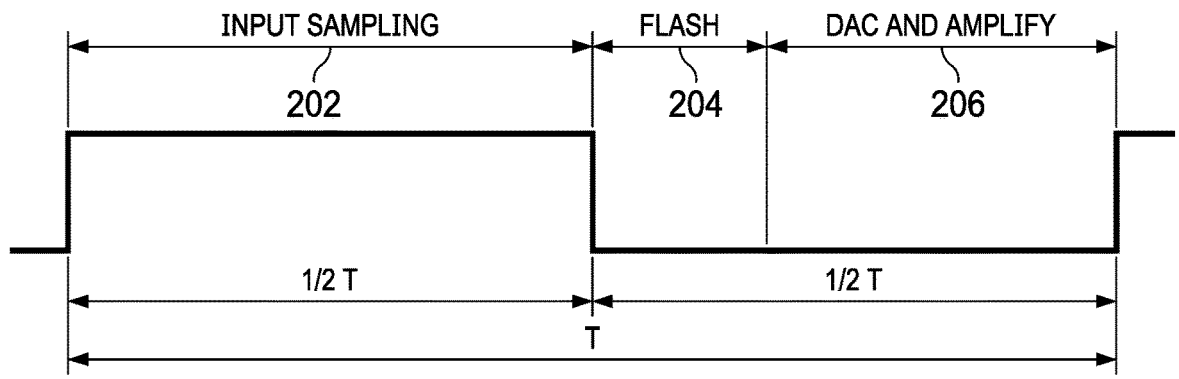
FIG. 2 shows a timing diagram applicable to the ADC stage of FIG. 1.

FIG. 1 illustrates a clock signal (CLK) provided to the SH 102, flash converter 104, and DAC 106. The same or different clock signal may be provided to these SH 102, flash converter 104, and DAC 106. FIG. 2 illustrates a timing diagram for the operation of the single stage 100 of the pipelined ADC architecture. The clock period is shown as T. In the first half cycle, the SH 102 samples VIN (202). During an initial portion 204 of the next half cycle, the flash converter 104 operates to convert the sampled input voltage to a digital representation. In the remaining portion 206 of the second half cycle, the DAC 106 converts the digital value from flash converter 106 to an analog equivalent and the amplifier 110 amplifies the difference signal from voltage subtractor 108 to generate the residue signal.

At higher clock speeds, the period T is smaller, and thus the amount of time to sample in the input and perform each of the flash conversion, the digital-to-analog conversion, and amplification becomes smaller. At radio frequency (RF) speeds (e.g., more than 1 giga samples per second (GSPS), the architecture shown in FIG. 1 becomes impractical. For example, at 3 GSPS, the amount of time that that the flash converter 104, DAC 106, and amplifier 110 would have would be around 140 picoseconds (ps). However, the comparators within the flash converter 104 may require, for example, 80 ps to compare the sampled input voltage to the respective reference voltages, which does not provide sufficient time for the DAC 106 and amplifier 110.

Figure 3:
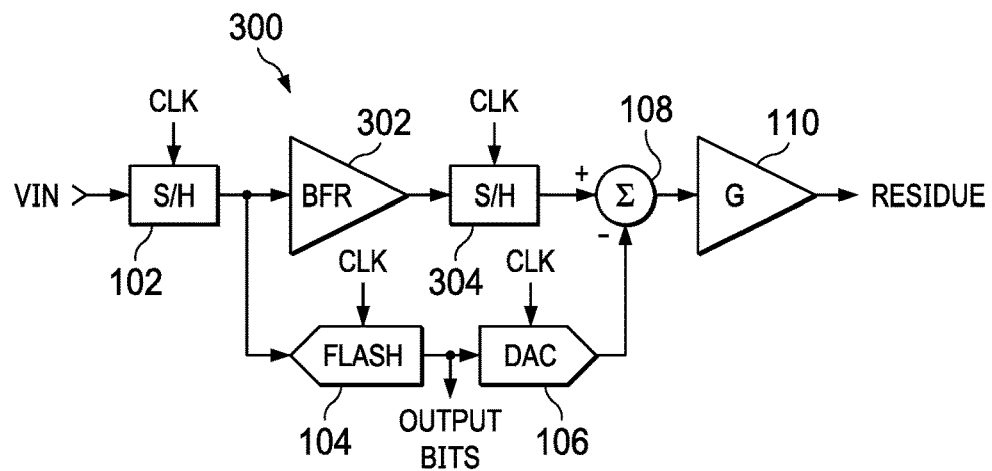
FIG. 3 illustrates another example architecture for stage of a pipelined ADC.
Figure 4:
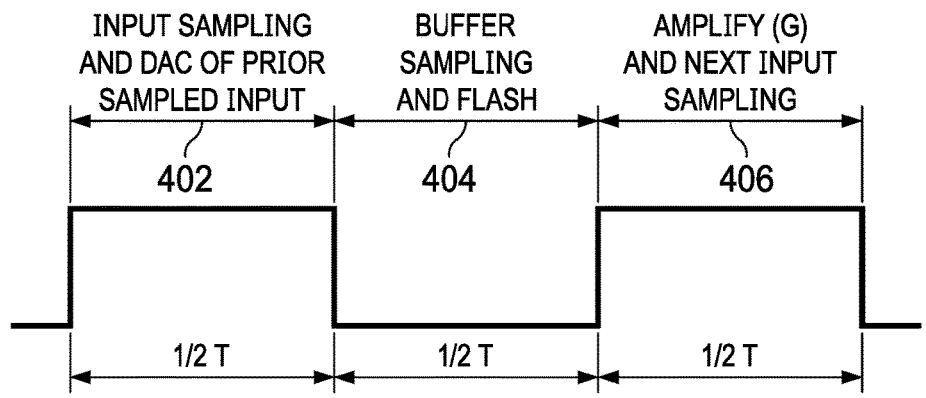
FIG. 4 shows a timing diagram applicable to the ADC stage of FIG. 3.

The example ADC stage 300 of FIG. 3 addresses the timing problem described above through the inclusion of buffer 302, along with a second SH 304. The buffer 302 operationally delays the sampled input voltage before reaching the voltage subtractor 108 to provide additional time for the flash converter 104 to convert the sampled input voltage from SH 102 to a digital representation. FIG. 4 shows a timing diagram corresponding to FIG. 3. In the first half cycle 402, the input voltage VIN is sampled by SH 102. Also, in the same half cycle 402, the DAC 106 receives flash converter 104's digital value of a previous sampled VIN and converts that digital value to an analog voltage. In the second half cycle 404, SH 304 samples the output of buffer 302 (which is a delayed version of the SH 102's output). Also, in the same half cycle 403, the flash converter 104 converts the sampled input voltage from the first half cycle 402 to a digital value. In the next half cycle 406, amplifier 110 amplifies the difference signal from voltage subtractor 108, while SH 102 again samples VIN.

Figure 5:
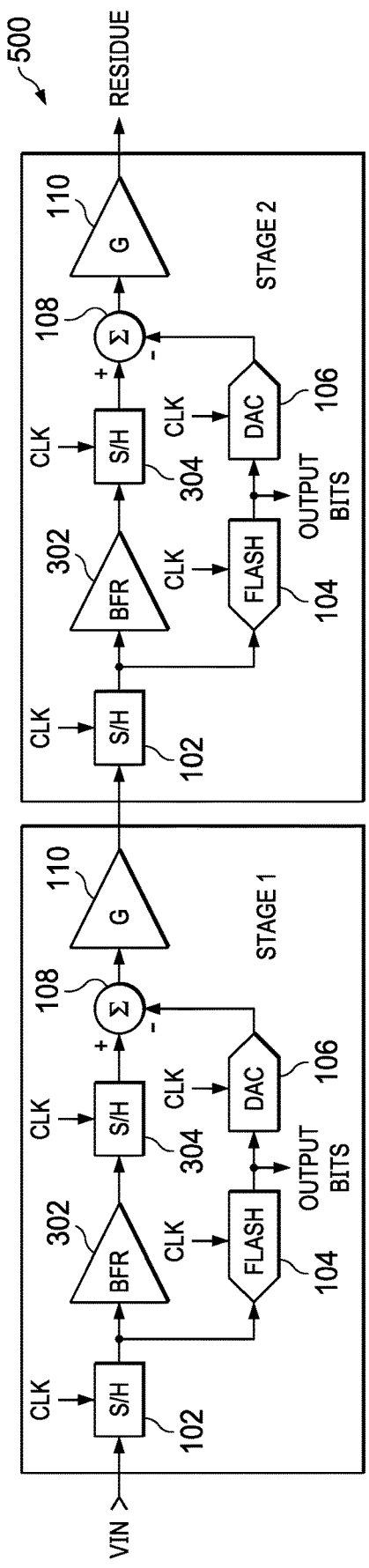
FIG. 5 illustrates two example stages using the architecture of FIG. 3.

FIG. 5 shows two back-to-back stages—Stage 1 and Stage 2—of a pipelined ADC. Each of stages Stage 1 and Stage 2 includes the components described above regarding FIG. 3. As such, Stage 1 and Stage 2 both include a buffer 302 and two SHs 102 and 304. While the buffers 302 provides sufficient time for the ADC to operate even at sample speeds in excess of 1 GSPS, the buffer 302 increases the overall power consumption of the ADC. Further, the buffers 302 and the extra SH 304 introduce additional noise into the ADC signal chain.

Figure 6:
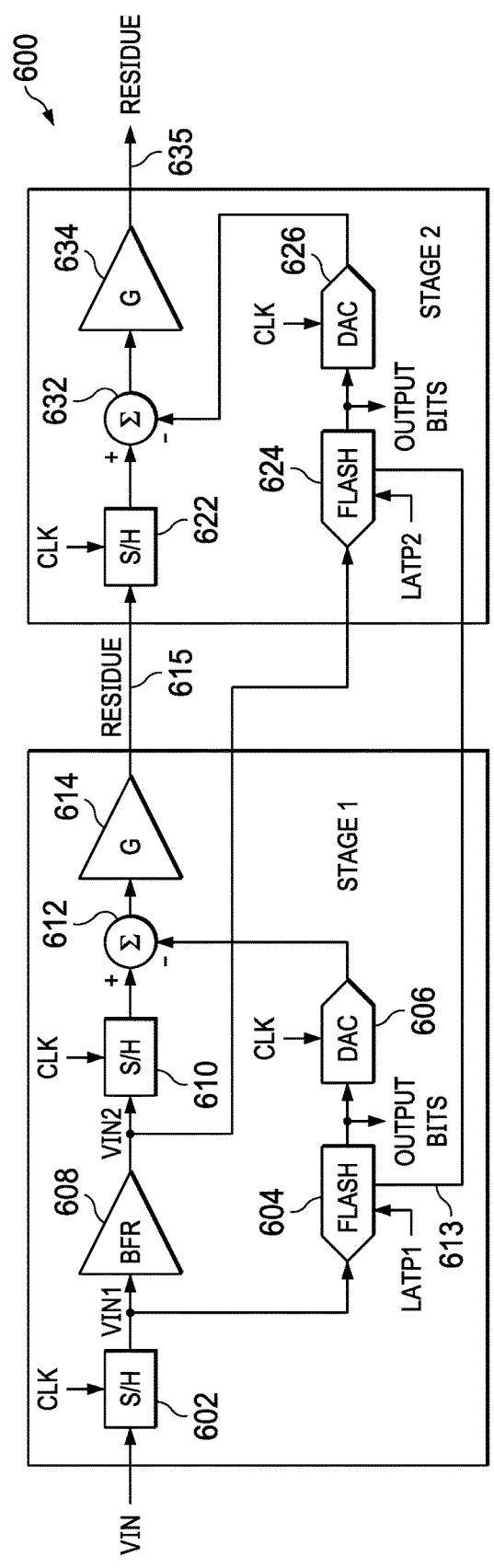
FIG. 6 shows another example of an architecture of two stage pipelined ADC.

FIG. 6 also shows an example of two stages—Stage 1 and Stage 2—of a pipelined ADC 600. The architecture of Stage 1 differs from the architecture of Stage 2 in this example. Stage 1 includes SHs 602 and 610, a flash converter 604, a DAC 606 (e.g., capacitive DAC), a buffer 608, a voltage subtractor 612, and an amplifier 614 (with gain G). The analog input voltage is shown as VIN and is sampled and held by SH 602 to produce a sampled value shown as VIN1. The sampled input voltage from SH 602 is provided to flash converter 604, which converts the sampled input voltage to a digital representation. VIN1 is also provided to, and buffered by, buffer 608 to produce buffer output signal VIN2. VIN2 is then sampled and held by SH 610. The flash converter 604 includes multiple comparators, and each comparator compares the sampled input voltage to a separate reference voltage. The flash converter 604's output is converted back to an analog signal by DAC 606. The analog output from DAC 606 is then subtracted from the sampled output from buffer 608 by voltage subtractor 608. The difference signal from voltage subtractor 608 is then amplified by amplifier 610 to produce a residue 615, which is then provided to Stage 2 of the pipelined architecture of FIG. 6.

Stage 2 of FIG. 6 includes SH 622, a flash converter 624, a DAC 626 (e.g., capacitive DAC), a voltage subtractor 632, and an amplifier 634 (with gain G). The residue 615 from Stage 1 is sampled and held by SH 622, and provided to voltage subtractor 632. VIN2 (output signal from buffer 608 of Stage 1) is provided to flash converter 624 of Stage 2, which converts VIN2 into a digital representation. The flash converter 624 includes multiple comparators, and each comparator compares the sampled input voltage to a separate reference voltage. The flash converter 624's output is converted back to an analog signal by DAC 626. The analog output from DAC 626 is then subtracted from the sampled residue by voltage subtractor 632. The difference signal from voltage subtractor 632 is then amplified by amplifier 634 to produce a residue 635, which is then provided to a subsequent stage of the pipelined architecture.

Stage 1 generates the n most significant bits of the digital representation of VIN, and Stage 2 generates the m next most significant bits of the digital representation of VIN. The values of n and m may be the same or different.

Referring back to the example of FIG. 5, both of Stages 1 and 2 of FIG. 5 include buffers 302. Further, the flash 104 in Stage 2 of FIG. 5 converts the sampled residue from Stage 1 to a digital representation. As shown in FIG. 6, however, Stage 1 includes buffer 608, but Stage 2 does not include a buffer. Further, the input to flash converter 624 of Stage 2 is the output of buffer 608 of Stage 1. Thus, unlike the example of FIG. 5, the flash converter 624 of Stage 2 converts the sampled and buffered VIN from Stage 1, rather than the residue signal from Stage 1. As is described below, the flash converter 624 is clocked using LATP2 as well as a control signal 613 derived from the output signals generated by flash converter 604. The clock signals to the flash converters 604 and 624 are shown as LATP1 and LATP2, respectively. Additional stages may be included as well. Each subsequent stage may have the same architecture as Stage 2. The flash converter of each subsequent Nth stage (subsequent to Stage 2) receives as an input the residue from N−2 stage, and has its flash converter controlled by control signals derived from the output of the flash converter of the N−1 stage. For example, the flash converter of Stage 3 receives the residue from Stage 1 as an input. The output from the flash converter of Stage 2 is used to control the flash converter of Stage 3. A final stage of the pipelined ADC may include a flash converter, but no DAC, voltage subtractor, nor amplifier.

Figure 7:
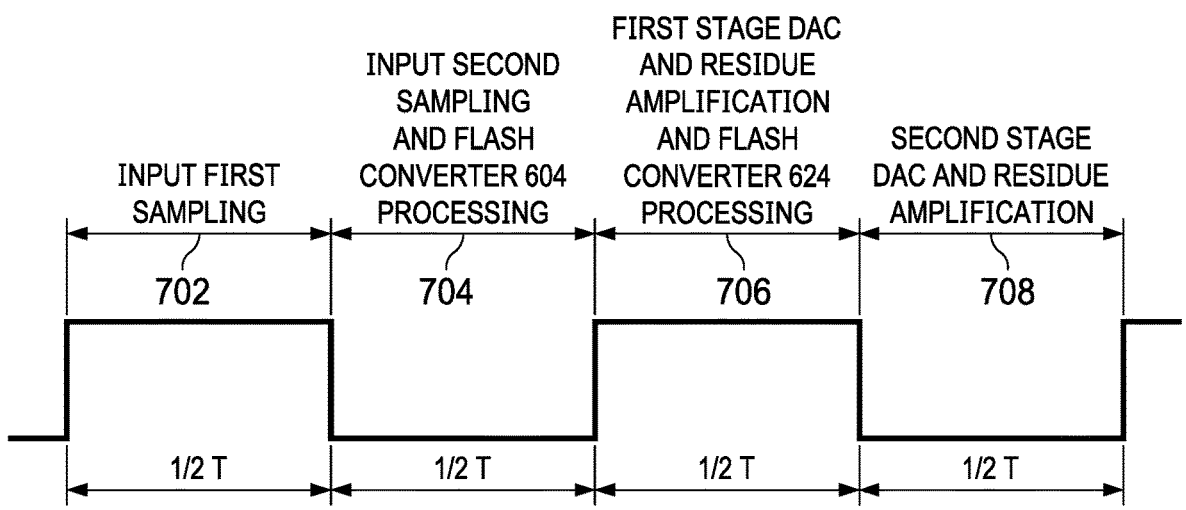
FIG. 7 shows a timing diagram applicable to the ADC stages of FIG. 6.

FIG. 7 shows an example timing diagram. In the first half cycle 802, the input voltage VIN is sampled by SH 602 of Stage 1. During the next half cycle 704, the second SH 610 of Stage 1 samples the buffer 608's output. Also during this half cycle 704, the flash converter 604 of Stage 1 converts VIN1 to a digital representation. During the next half cycle 706, the DAC 606 of Stage 1 converts the output from flash converter 604 generated during the previous half cycle 704 to an analog equivalent. Further, during half cycle 706, amplifier 614 amplifies the difference signal from voltage subtractor 612 to residue 615. Also, during half cycle 706, the flash converter 624 of Stage 2 converts VIN2 from buffer 608 to a digital representation. During half cycle 708, the DAC 626 of Stage 2 converts the output from flash converter 624 generated during the previous half cycle 706 to an analog equivalent, and amplifier 634 amplifies the difference signal from voltage subtractor 632.

Figure 8:
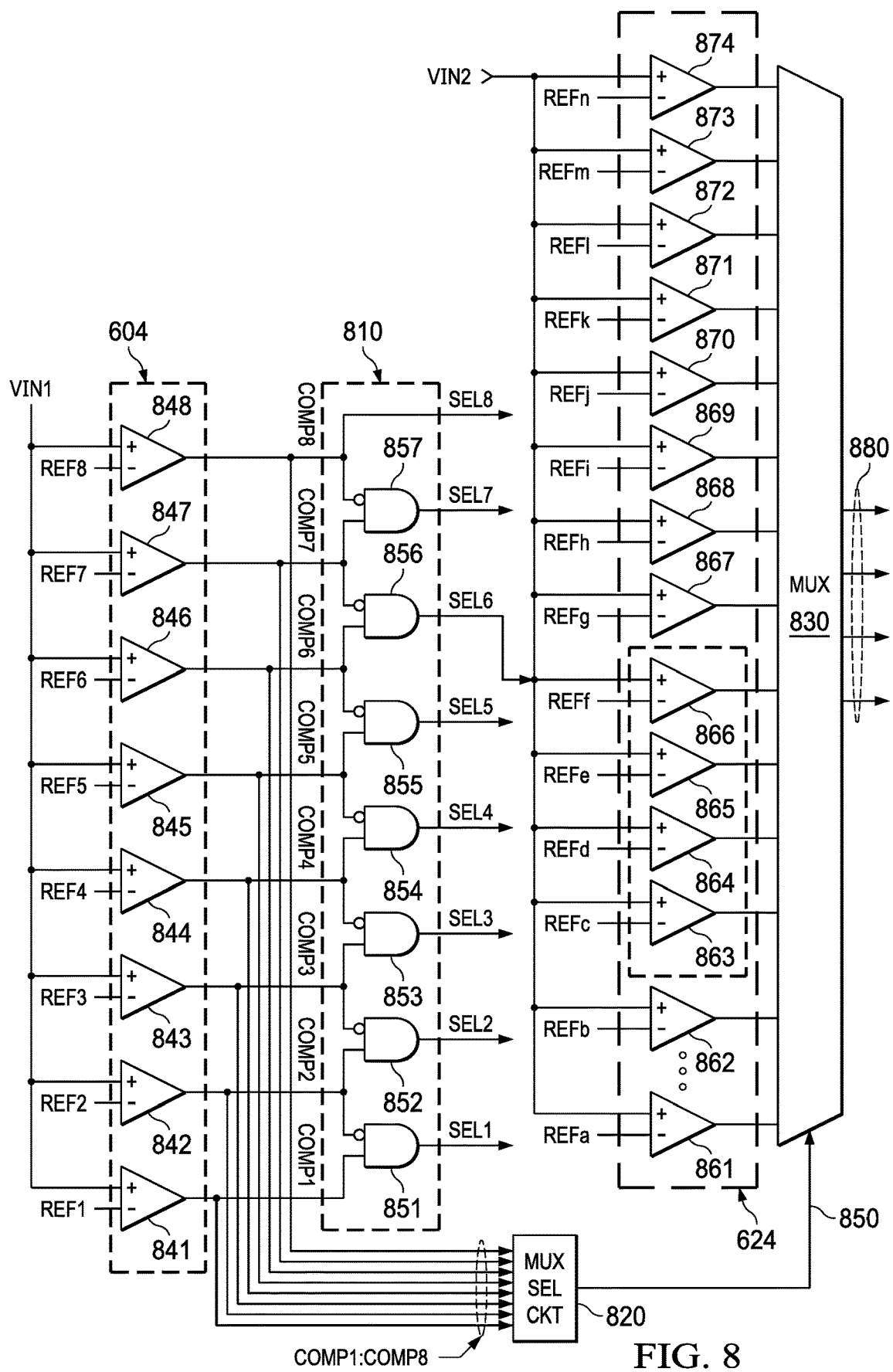
FIG. 8 shows an example implementation of at least some of the stages of the ADC of FIG. 6.

FIG. 8 illustrates the comparators of flash converter 604 of Stage 1, the comparators of flash converter 624 of Stage 2, logic circuit 810, multiplexer select circuit 820, and multiplexer 830. Any or all of the logic circuit 810, multiplexer select circuit 820, and multiplexer 830 may be part of flash converter 604, or part of flash converter 624, or separate from either flash converter. In this example, flash converter 604 of Stage 1 comprises a 3-bit converter to generate a 3-bit digital representation of VIN1. As a 3-bit flash converter, flash converter 604 includes eight comparators 841-848. Each comparator includes a positive input, a negative input, and a comparator (COMP) output. The positive inputs for the comparators 841-848 are coupled to VIN1, and the negative inputs are coupled to separate reference voltages. The negative inputs of comparators 841, 842, 843, 844, 845, 846, 847, and 848 are coupled to reference voltages Ref1, Ref2, Ref3, Ref4, Ref5, Ref6, Ref7, and Ref8, respectively.

From Ref1 to Ref8, the voltage of each subsequent reference voltage is greater than the preceding reference voltage. Thus, Ref2 is greater Ref1, Ref3 is greater than Ref1, and so on. Comparator 841 asserts its output signal COMP1 high when VIN1 is greater than Ref1, and low otherwise. Comparator 842 asserts its output signal COMP2 high when VIN1 is greater than Ref2, and low otherwise. Comparator 843 asserts its output signal COMP3 high when VIN1 is greater than Ref3, and low otherwise. Comparator 844 asserts its output signal COMP4 high when VIN1 is greater than Ref4, and low otherwise. Comparator 845 asserts its output signal COMP5 high when VIN1 is greater than Ref5, and low otherwise. Comparator 846 asserts its output signal COMP1 high when VIN6 is greater than Ref6, and low otherwise. Comparator 847 asserts its output signal COMP7 high when VIN1 is greater than Ref7, and low otherwise. Comparator 848 asserts its output signal COMP8 high when VIN1 is greater than Ref8, and low otherwise. The comparators' output signals indicate the relative level of VIN1. For example, if VIN1 is between Ref6 and Ref7 (i.e., Ref6<VIN1<Ref7), then COMP1 through COMP6 will be logic high, and COMP7 and COMP8 will be logic low, that is, COMP1 through COMP8 will be 11111100. The COMP1-COMP8 signals comprise the digital value from flash converter 604 and can be converted to a 3-bit binary value, and provided to DAC 606 as described above.

The COMP1-COMP8 signals, in this example, also are used to control the operation of flash converter 624 in Stage 2. The Stage 2 flash converter 624 in this example, comprises a 2-bit converter, and thus four comparators are used to generate the digital output value from flash converter 624. In the example of FIG. 5, the flash converter 104 of Stage 2 converted the sampled residue signal from Stage 1 to a digital representation. As such, the input voltage range of flash converter 104 in Stage 2 is limited to the residue range, and only four comparators are included (assuming, for example, a 2-bit resolution for flash converter 104 of Stage 2). However, in the example of FIG. 6, the flash converter 624 of Stage 2 converts buffered output signal VIN2 to a digital presentation, and VIN2 includes the full range of VIN. As such, $2^{(M+N)}$ comparators (where M is the resolution of Stage 1 and N is the resolution of Stage 2) are included within flash converter 624. If the resolution of Stage 1 is 3-bits (M=3) and the resolution of Stage 2 is 2-bits (N=2), then flash converter 624 includes $2^5$ (32) comparators 861-874. Each comparator 861-874 includes a positive input, a negative input, and an output. VIN2 is coupled to each of the positive inputs, and each negative input receives a separate reference voltage Refa-Refn, as shown. As was the case for the comparators of flash converter 604, the reference voltages provided to the comparators of flash converter 624 increase in magnitude from comparator 861 to comparator 874. For example, Refb is greater than Refa, Refc is greater than Refb, and so on.

Only four comparators from among comparators 861-874 are used (assuming a 2-bit flash converter 624 resolution) as the digital value from flash converter 624, and the COMP1-COMP8 bits from flash converter 604 are used to cause the appropriate four comparators from flash converter 624 to be selected via multiplexer 830. Logic circuit 810 and multiplexer select circuit 820 are used in this regard.

Logic circuit 810 includes AND gates 851-857. One input of each AND gate 851-857 is inverted, or a separate inverter can be provided for one of the AND gate inputs. Each AND gate determines the logical AND of one comparator 841-848 outputs and the inverted output of the next comparator output in sequence. As such, AND gate 851 determines COMP1 AND COMP2_BAR (where COMP2_BAR is the logical inverse of COMP2) to produce select signal SEL1. AND gate 852 determines COMP2 AND COMP3_BAR (where COMP3_BAR is the logical inverse of COMP3) to produce select signal SEL2. AND gate 853 determines COMP3 AND COMP4_BAR (where COMP4_BAR is the logical inverse of COMP4) to produce select signal SEL3. AND gate 854 determines COMP4 AND COMP5_BAR (where COMP5_BAR is the logical inverse of COMP5) to produce select signal SEL4. AND gate 855 determines COMP5 AND COMP6_BAR (where COMP6_BAR is the logical inverse of COMP6) to produce select signal SEL5. AND gate 856 determines COMP6 AND COMP7_BAR (where COMP7_BAR is the logical inverse of COMP7) to produce select signal SEL6. AND gate 857 determines COMP7 AND COMP8_BAR (where COMP8_BAR is the logical inverse of COMP8) to produce select signal SEL7. The last select signal is SEL8 and is the output signal COMP8 from comparator 848.

The logic operation implemented by AND gates 851-857 (with one input being inverted) is such that a select signal SEL1-SEL8 will only be a logic high when the non-inverted input is 1 and the other input is 0. For example, SEL6 will be a 1 when COMP6 is a 1 and COMP7 is a 0. Otherwise, each select signal is a logic 0. Thus, a select signal indicates the transition of the COMP signals from a 1 to a 0, which indicates that the voltage level of VIN1 is between the reference voltages of the two comparators whose COMP outputs are coupled to the AND gate that produced the select signal that is a 1. For example, SEL6 will only be a 1 if VIN1 is between Ref6 and Ref7.

Each select signal SEL1-SEL8 is used to enable a particular set of comparators within the Stage 2 flash converter 624. In the example of FIG. 8, SEL6 is used to enable comparators 863-866. Select signal SEL7 is used to enable comparators 867-870, and SEL8 is used to enable comparators 871-874. Each of the other select signals also enable a given set of comparators within the flash converter 624. The use of the select signals to enable/disable their corresponding set of comparators is discussed below regarding FIG. 13.

The outputs from comparators 861-874 of the flash converter 624 are couple to corresponding inputs of multiplexer 830. Multiplexer select circuit 820 receives the COMP1:COMP8 signals from the flash converter 604 and processes those signals to generate a multiplexer select signal 850 to cause the multiplexer 830 to select as its outputs 880 the particular four comparator outputs corresponding to the asserted select signal. In the example of FIG. 8, if SEL6 is asserted, then the outputs of comparators 863-866 are coupled to the outputs 880 of multiplexer 830 as the digital output of flash converter 624. The four bits from multiplexer 830 can be converted to a 2-bit binary value which is then provided to DAC 626.

Although relatively rare, it is possible that one of the COMP1 through COMP8 bits is of the opposite polarity from what it should be. For example, if the thresholds of consecutive comparators 841-848 cross each other due to offset differences between the comparators, then, instead of the COMP1:COMP8 signals between a series of 1s followed by 0's (e.g., 11100000) as should be the case, the COMP1:COMP8 signals could have two 1-0 transitions (e.g., 11101000). As explained above, a 1 to 0 transition between successive comparator output signals (starting from COMP1 and proceeding to COMP8) indicates that VIN1 is between the reference voltages of the comparators 841-848 corresponding to 1 to 0 transition. The select signal from that AND gate 851-857 will be asserted to indicate the 1 to 0 transition. However, if the COMP1:COMP8 signals includes two 1 to 0 transitions, two select signals SELx will be asserted high. This condition is referred to as a "bubble." The select signal indicating the 1 to 0 transition closest to COMP1 of comparator 841 having the smallest reference voltage Ref1 should be selected.

FIG. 9A shows example implementation of the multiplexer select circuit 820. The multiplexer select circuit 820 includes multiple logic circuits 901a, 901b, 901c, etc., each logic circuit 901 configured to receive four consecutive COMP signals from the comparators of the flash converter 604. In FIG. 9A, the inputs are designated A, B, C, and D. The D input is inverted as shown. Input A receives one comparator COMP1-COMP8 signal. B receives the next consecutive COMP signal, C the next, and D the next. For example, COMP1 through COMP4 of FIG. 8 are provided to inputs A through D, respectively, of logic circuit 901a. COMP2-COMP5 are similarly provided to inputs A through D of the next logic circuit 901b, COMP3-COMP6 provided to A through D of the next logic circuit 901c, and so on.

Each logic circuit comprises an AND gate 902 and an exclusive OR gate 910. The exclusive OR gate 910 determines the exclusive OR of inputs B and C. The output of exclusive OR gate 910 is logically ANDed with A and D. The output signal from each logic circuit 901 is a multiplexer select signal (MUX SEL) and collectively represent the multiplexer select signal 850 shown in FIG. 8. A MUX SEL signal is only asserted high (1) when both A is a logic 1, D is a logic 0, and the exclusive OR gate generates a logic 1 (which only happens when B and C are of opposite polarity). The logic implementation of logic circuits 901 means that, as shown in FIG. 9B, the MUX SEL will only be a 1 when A-D are either (a) 1-1-0-0, or (b) 1-0-1-0.

Figure 10:
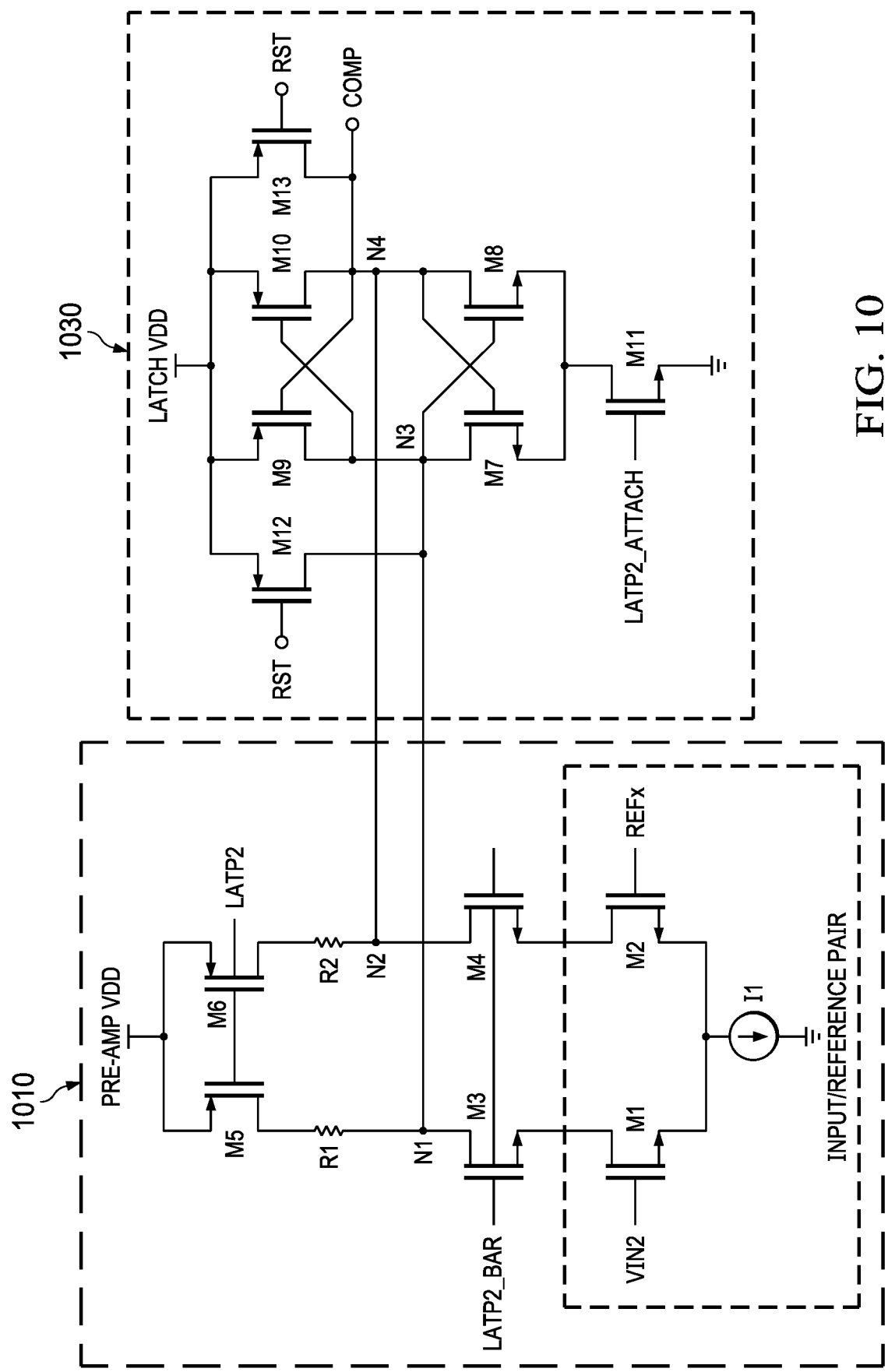
FIG. 10 shows an example implementation of a comparator usable in flash converters usable in the example of FIG. 6.

FIG. 10 shows an example implementation of a comparator usable for the flash converter 624 of Stage 2, but usable as well for the flash converter of Stage 1 or any other stage of the pipelined ADC. The comparator in the example of FIG. 10 includes a pre-amplifier (pre-amp) 1010 coupled to a latch 1030. The pre-amp 1010 in this example includes transistors M1, M2, M3, M4, M5, and M6, resistors R1 and R2, and current source device 11. M1-M4 comprise n-type metal oxide semiconductor field effect transistors (NMOS) in this example, and M5 and M6 comprise p-type metal oxide semiconductor field effect transistors (PMOS). The sources of M1 and M2 are connected to the current source device 11. The drains of M1 and M2 are connected to the sources of M3 and M4, respectively, and the drains of M3 and M4 are connected to R1 and R2, respectively. The drains of M5 and M6 are connected to the opposing terminals of R1 and R2, and the sources of M5 an M6 are connected to a supply voltage node (VDD). The input voltages to be compared are provided to the gates of M1 and M2. For example, VIN2 is provided to the gate of M1, and REFx is provided to the gate of M2. The pre-amp 1010 can be enabled or disabled via the clock signal LATP, which controls the gates of M5 and M6. A low level of LATP (e.g., more than the threshold voltage of M5 and M6 below VDD) turns on M5 and M6, and a high level (within a threshold voltage of VDD) turns of M5 and M6. The logical inverse of LATP (LATP_BAR) controls the gates of M3 and M4. The output from the pre-amp 1010 is taken from nodes N1 (node interconnecting M3 and R1) and N2 (node interconnecting M4 and R2).

The pre-amp 1010 comprises two current branches. One branch comprises M5, R1, M3, and M1. The other branch comprises M6, R2, M4, and M2. Thus, current source device 11 causes current to flow through one of the branches or the other of the pre-amp based on the relative size of the VIN2 and REFx. If VIN2 is greater than REFX, M1 turns on "harder" than M2, and more of the current source device 11 current flows from VDD and through M5, R1, M3, and M1 to ground. In this state, the voltage on N2 is greater than the voltage on N1. Similarly, if REFx is greater than VIN2, M2 turns on harder than M1, and more of the current source device 11 current flows from VDD and through M6, R2, M4, and M2 to ground. In this state, the voltage on N1 is greater than the voltage on N2.

The latch 1030 in the example of FIG. 10 includes M7, M8, M9, M10, M11, M12, and M13 with M7-M10 configured as two pairs of cross-coupled transistors. M7-M9 comprise NMOS transistors. The sources of M7 and M8 connect to the drain of M11, and the drains of M7 and M8 connect to the drains of M9 and M10, respectively. The drains of M7 and M9 also connect to the gates of M8 and M10, and the drains of M8 and M10 connect to the gates of M7 and M9. Node N3 is the node interconnecting the drains of M7 and M9, and node N4 is the node interconnecting the drains of M8 and M10. The COMP output of the latch 1030 is taken as the voltage on N4. M12 and M13 can be turned on via a reset signal (RST) to reset the pull both nodes N3 and N4 high thereby resetting the latch's COMP output to a 1.

Nodes N1 and N2 from the pre-amp 1010 connect to nodes N3 and N4, respectively, of the latch 1030. With M11 turned on via the control signal LATP_ASYNCH (described below) provided to its gate, the latch 1030 regenerates the voltages from N1 and N2 onto N3 and N4. The latch 1030 holds the voltages on N3 and N4 even if the pre-amp 1010 no longer actively drives the voltages on N1 and N2. For example, if N4 is greater than N3, M7 turns on thereby reinforcing the low voltage on N3. With N3 being low, M10 is turned on thereby reinforcing the higher voltage on N4.

FIG. 11 shows an example timing diagram for the operation of the comparator of FIG. 10. During the first half cycle 1102, the comparators of flash converter 604 of Stage 1 regenerate to produce their comparator output data. By 1103 within the first half cycle, the comparators of flash converter 604 have had enough time to regenerate and their output data has settled. At the beginning of the next half cycle 1104, the pre-amps 1010 of the comparators of Stage 2's flash converter 624 are enabled (LATP asserted low, and LATP_BAR asserted high). During this half cycle 1104, the latches 1030 of the flash converter 624 also regenerate to produce their COMP output data. In this example, because the flash converter 604 data have settled before the end of the first half cycle 1102, the flash converter 624 begins regeneration within its latches 1030 synchronous with the pre-amps 1010 being enabled.

Figure 12:
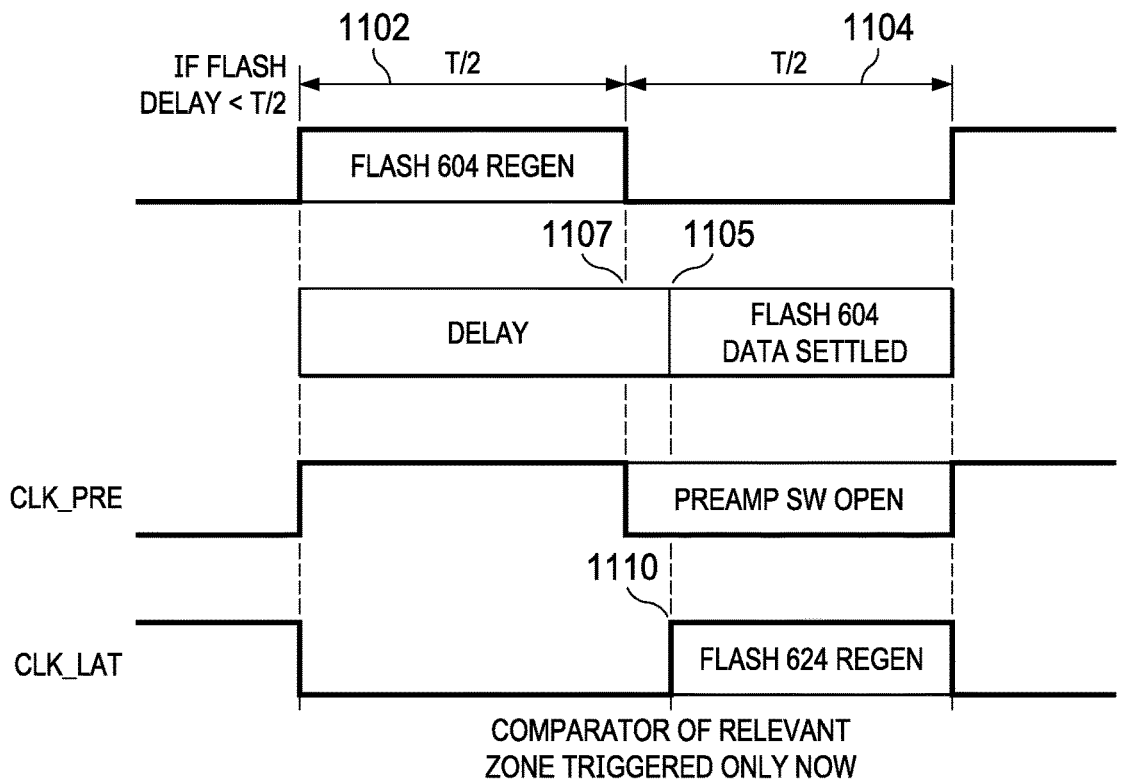
FIG. 12 shows another example of a timing diagram pertain to the comparator of FIG. 10.

However, it is possible that the flash converter 604's data has not settled by the time that half cycle 1104 begins for the comparators of the flash converter 624 to operate. That the flash converter 604 takes more than half cycle 1102 to settle can occur if VIN1 is close to the reference voltage of one of the flash converter comparators 841-848. FIG. 12 shows a timing diagram similar to that of FIG. 11, but illustrating a situation in which the data from the flash converter 604 does not settle until 1105 meaning that the data from flash converter 604 is not available until 1105 (which is within the second half cycle 1104). Due to the timing of the SH 602 within Stage 1, VIN2 needs to be sampled by the pre-amp 1010 of flash converter 624 within Stage 2 by the end of the first half cycle 1102 (point 1107); else VIN2 will have changed. Thus, the pre-amps 1010 should be enabled to use VIN2 and the reference voltage to generate the voltages on N1 and N2 during the first half cycle 1101, but then be disabled at 1107 to avoid processing a new level of VIN2. The latches 1030 within the flash converter 624 should not be enabled, however, until the data from the flash converter 604 have settled at 1110; else the control of the logic circuit 810, multiplexer select circuit 820, and multiplexer 830 (which uses the COMP signals from flash converter 604) may not be correct.

Figure 13:
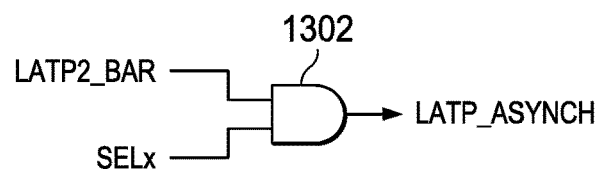
FIG. 13 shows an example implementation of a logic circuit usable to enable and disable a latch for the comparator of FIG. 10.

FIG. 13 shows an example of the generation of LATP_ASYNCH to control the latches 1030. An AND gate 1302 logically ANDs together LATP_BAR with the select signal (SELx) used to select the subgroup of comparators 861-874 within flash converter 624. As explained above, SEL is asserted high when consecutive COMP signals from corresponding comparators 841-848 are 1 followed by 0. Thus, the select signal is used asynchronously gate off LATP_BAR until a valid 1 to 0 transition is detected from among the comparators 841-848.

Figure 14:
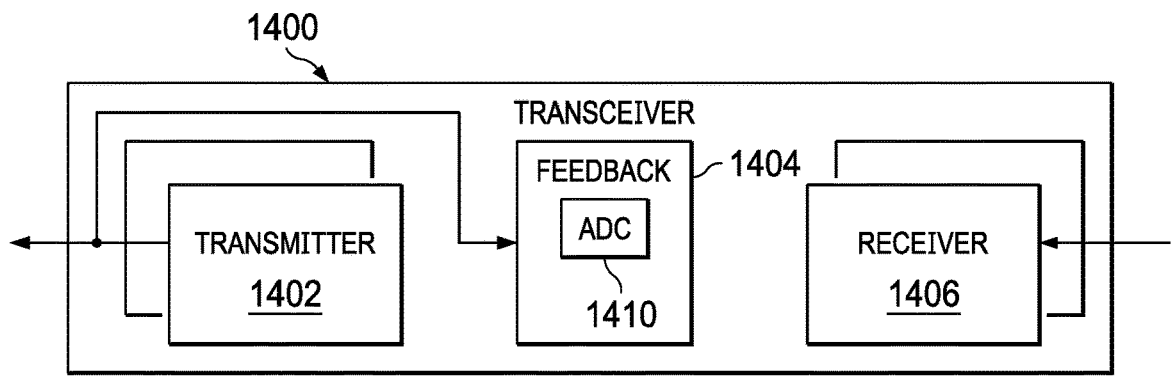
FIG. 14 shows an example implementation of a transceiver in which the ADC of FIG. 6 is usable.

FIG. 14 provides an example of a transceiver 1400 comprising one or more transmitters 1402, a feedback circuit 1404, and one or more receivers 1406. The feedback circuit 1404 includes at least one pipelined ADC 1410 such as that described herein. The feedback circuit 1404 receives the transmitter's output signal and processes the output signal to measure the non-linearity in the transmit signal path. The measured non-linearity is then used by the feedback circuit 1404 to correct the transmit path on the fly. The non-linearity correction is particular useful as an amplifier within the transmitter 1402 may have a non-linear performance. The ADC 1410 is used to aide in measuring the non-linearity of the transmit signal path. The ADC 1410 converts the transmitter's output signal to a digital representation for further processing within the feedback circuit 1404. The feedback circuit 1404 can be used to calibrate each of multiple transmitters 1402.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. An analog-to-digital converter (ADC), comprising:
a first stage including:
a first sample-and-hold (SH) having an input coupled to a voltage input node of the ADC, and having a first SH output;
a buffer having an input coupled to the first SH output, and having a buffer output;
a first flash converter having an input coupled to the first SH output, and having a first flash converter output; and
a first digital-to-analog converter (DAC) having an input coupled to the first flash converter output; and
a second stage including a second flash converter having an input coupled to the buffer output;
wherein the second flash converter is configured to be clocked based on a control signal derived from the first flash converter.

2. An analog-to-digital converter (ADC), comprising:
a first stage including:
a first sample-and-hold (SH) having an input coupled to a voltage input node of the ADC, and having a first SH output;
a buffer having an input coupled to the first SH output, and having a buffer output;
a first flash converter having an input coupled to the first SH output, and having a first flash converter output; and
a first digital-to-analog converter (DAC) having an input coupled to the first flash converter output; and
a second stage including a second flash converter having an input coupled to the buffer output;
wherein the first flash converter includes a plurality of comparators, each of the plurality of comparators having a comparator output, and the ADC further comprises a first logic circuit coupled to the comparator output of each of the plurality of comparators.

3. The ADC of claim 2, wherein the first logic circuit is configured to generate a logic 1 responsive to one of the comparator outputs being a logic 1 and another comparator output is a logic 0.

4. The ADC of claim 2, wherein the first logic circuit includes a plurality of AND gates, each of the plurality of AND gates having first and second inputs, the first input coupled to one of the comparator outputs, and the second input coupled to another of the comparator outputs.

5. The ADC of claim 4, wherein the second flash converter includes a plurality of comparators, and the ADC further includes a multiplexer coupled to the second flash converter's plurality of comparators, the multiplexer being configured to select, as an output from the multiplexer, a subset of the second flash converter's plurality of comparators.

6. The ADC of claim 5, further comprising a second logic circuit coupled to the comparator output of each of the plurality of comparators of the first flash converter, the second logic circuit configured to generate a selection signal for the multiplexer.

7. The ADC of claim 6, wherein the second logic circuit is configured to generate the selection signal to cause the multiplexer to a particular subset of the second flash converter's plurality of comparators responsive either to a consecutive sequence of the comparator outputs of the first flash converter comprising an alternating sequence of 0s and 1s or to a consecutive sequence of the comparator outputs of the first flash converter comprising a 1-1-0-0 sequence.

8. An analog-to-digital converter (ADC), comprising:
a first stage including:
a first sample-and-hold (SH) having an input coupled to a voltage input node of the ADC, and having a first SH output;
a buffer having an input coupled to the first SH output, and having a buffer output;
a first flash converter having an input coupled to the first SH output, and having a first flash converter output; and
a first digital-to-analog converter (DAC) having an input coupled to the first flash converter output; and
a second stage including a second flash converter having an input coupled to the buffer output;
wherein the second flash converter comprises a plurality of comparators, and each of the plurality of comparators includes a pre-amplifier and a latch, wherein the latch is configured to be clocked asynchronously with respect to the pre-amplifier.

9. The ADC of claim 8, wherein:
the first flash converter includes a plurality of comparators, each of the plurality of comparators having a comparator output, and the ADC further comprises a first logic circuit coupled to the comparator output of each of the plurality of comparators,
the first logic circuit having as outputs a plurality of selection signals; and
for each latch, the pre-amplifier is configured to be clocked by a clock signal, and the latch is configured to be clocked based on the clock signal and one of the selection signals.

10. A transceiver, comprising:
a transmitter; and
an analog-to-digital converter (ADC) coupled to the transmitter, the ADC comprising a first stage and a second stage;
the first stage including:
a first sample-and-hold (SH) having an input coupled to a voltage input node of the ADC, and having a first SH output;
a buffer having an input coupled to the first SH output, and having a buffer output;
a first flash converter having an input coupled to the first SH output, and having a first flash converter output; and
a first digital-to-analog converter (DAC) having an input coupled to the first flash converter output; and
the second stage including a second flash converter having an input coupled to the buffer output;
wherein the second flash converter is configured to be clocked based on a control signal derived from the first flash converter.

11. A transceiver, comprising:
a transmitter; and
an analog-to-digital converter (ADC) coupled to the transmitter, the ADC comprising a first stage and a second stage;
the first stage including:
a first sample-and-hold (SH) having an input coupled to a voltage input node of the ADC, and having a first SH output;
a buffer having an input coupled to the first SH output, and having a buffer output;
a first flash converter having an input coupled to the first SH output, and having a first flash converter output; and
a first digital-to-analog converter (DAC) having an input coupled to the first flash converter output; and
the second stage including a second flash converter having an input coupled to the buffer output;
wherein the first flash converter includes a plurality of comparators, each of the plurality of comparators having a comparator output, and the ADC further comprises a first logic circuit coupled to the comparator output of each of the plurality of comparators, and wherein the first logic circuit is configured to generate a logic 1 responsive to one of the comparator outputs being a logic 1 and another comparator output is a logic 0.

12. A transceiver, comprising:
a transmitter; and
an analog-to-digital converter (ADC) coupled to the transmitter, the ADC comprising a first stage and a second stage;
the first stage including:
a first sample-and-hold (SH) having an input coupled to a voltage input node of the ADC, and having a first SH output;
a buffer having an input coupled to the first SH output, and having a buffer output;
a first flash converter having an input coupled to the first SH output, and having a first flash converter output; and
a first digital-to-analog converter (DAC) having an input coupled to the first flash converter output; and
the second stage including a second flash converter having an input coupled to the buffer output;
wherein the first flash converter includes a plurality of comparators, each of the plurality of comparators having a comparator output, and the ADC further comprises a first logic circuit coupled to the comparator output of each of the plurality of comparators, and wherein the second flash converter includes a plurality of comparators, and the ADC further includes a multiplexer coupled to the second flash converter's plurality of comparators, the multiplexer being configured to select, as an output from the multiplexer, a subset of the second flash converter's plurality of comparators.

13. A transceiver, comprising:
a transmitter; and
an analog-to-digital converter (ADC) coupled to the transmitter, the ADC comprising a first stage and a second stage;
the first stage including:
a first sample-and-hold (SH) having an input coupled to a voltage input node of the ADC, and having a first SH output;
a buffer having an input coupled to the first SH output, and having a buffer output;
a first flash converter having an input coupled to the first SH output, and having a first flash converter output; and
a first digital-to-analog converter (DAC) having an input coupled to the first flash converter output; and
the second stage including a second flash converter having an input coupled to the buffer output;
wherein the second flash converter comprises a plurality of comparators, and each of the plurality of comparators includes a pre-amplifier and a latch, wherein the latch is configured to be clocked asynchronously with respect to the pre-amplifier.

14. An analog-to-digital converter (ADC), comprising:
a first stage including:
a buffer having an input configured to receive a sampled input voltage, and having a buffer output;
a first flash converter having an input configured to receive the sampled input voltage, and having a first flash converter output; and
a first digital-to-analog converter (DAC) having an input coupled to the first flash converter output; and
a second stage including a second flash converter having an input coupled to the buffer output, the second flash converter configured to operate using a control signal derived from the first flash converter.

15. The ADC of claim 14, wherein:
the first flash converter has a first resolution (m), and the first flash converter includes $2^m$ comparators; and the second flash converter has a second resolution (n), and
the second flash converter includes $2^{(m+n)}$ comparators.

16. The ADC of claim 14, wherein the second flash converter is configured to be clocked based on a control signal derived from output signals of the first flash converter.

17. The ADC of claim 14, wherein the first flash converter includes a plurality of comparators, each of the plurality of comparators having a comparator output, and the ADC further comprises a first logic circuit coupled to the comparator output of each of the plurality of comparators.

18. The ADC of claim 17, wherein the second flash converter includes a plurality of comparator, and the ADC further comprises:
  a multiplexer coupled to outputs of the plurality of comparators of the second flash converter; and
  a multiplexer selection circuit configured to control the multiplexer based on output signals from the first flash converter's plurality of comparators.

* * * * *